United States Patent
Takahashi et al.

(10) Patent No.: US 6,693,569 B2
(45) Date of Patent: *Feb. 17, 2004

(54) DECODING CIRCUIT, CODE CONVERSION CIRCUIT AND METHOD

(75) Inventors: Miki Takahashi, Tokyo (JP); Hiraku Takahashi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/121,702

(22) Filed: Apr. 15, 2002

(65) Prior Publication Data

US 2002/0158782 A1 Oct. 31, 2002

(30) Foreign Application Priority Data

Apr. 25, 2001 (JP) ......................................... 2001-127090

(51) Int. Cl.[7] ................................................. H03M 7/20
(52) U.S. Cl. ........................... 341/102; 341/57; 327/141
(58) Field of Search ................................. 341/102, 169, 341/57, 100; 327/141, 160, 144; 386/124; 326/108; 375/371

(56) References Cited

U.S. PATENT DOCUMENTS

| | | | | | |
|---|---|---|---|---|---|
| 3,905,029 | A | * | 9/1975 | McIntosh | 341/69 |
| 4,531,153 | A | * | 7/1985 | Watanabe | 386/124 |
| 4,651,029 | A | * | 3/1987 | Oritani | 326/108 |
| 4,661,801 | A | * | 4/1987 | Chen et al. | 341/57 |
| 5,485,490 | A | * | 1/1996 | Leung et al. | 375/371 |
| 5,862,180 | A | * | 1/1999 | Heinz | 375/244 |
| 6,002,279 | A | * | 12/1999 | Evans et al. | 327/144 |
| 6,232,895 | B1 | * | 5/2001 | Djupsjobacka et al. | 341/100 |
| 6,583,655 | B2 | * | 6/2003 | Takahashi et al. | 327/160 |

OTHER PUBLICATIONS

Takahashi et al., "Clock Control Cirucit", US Appliantion No. 10/146,827, filed on May 16, 2002.*

* cited by examiner

Primary Examiner—Jean Jeanglaude
(74) Attorney, Agent, or Firm—Sughrue Mion, PLLC

(57) ABSTRACT

To provide a code conversion circuit and a code converting method which are effective in reducing the circuit size. A 2N-bit signal, composed of a N-bit signal and a signal obtained on inverting respective N-bits of said N-bit signal, where N is an integer not less than 2, is received as an input, one of the 2N-bits is inverted to output 2N types decoded signals, in which one bit or plural neighboring (N−1) bits of the 2N-bits are of a first value, with the remaining bits being of a second value.

21 Claims, 6 Drawing Sheets

| BASIC3bit | BASIC3bit (INVERTED) | DECODE | 6bitSIGNAL |
|---|---|---|---|
| 000 | 111 | → | 000110 |
| 100 | 011 | → | 000011 |
| 110 | 001 | → | 100001 |
| 111 | 000 | → | 110000 |
| 011 | 100 | → | 011000 |
| 001 | 110 | → | 001100 |
| 000 | 111 | → | 000110 |

FIG. 1

DECODING CIRCUIT, CODE CONVERSION CIRCUIT AND METHOD

FIELD OF THE INVENTION

This invention relates to a decoding circuit, a code conversion circuit and to a code converting method.

BACKGROUND OF THE INVENTION

As a conventional code conversion circuit for converting an input digital code of a preset bit length (width) into another digital code, a decoding circuit is now explained. The decoding circuit receives an input signal, which gives e.g., six different values (0, 1, 2, 3, 4 and 5), and is represented by three bits in binary representation. The decoding circuit determines a set of two adjacent bits, each being at the logic value 1, depending on the input signal in six bits of an output signal representing a decoded result signal.

The decoding circuit is used in, for example, a circuit and the like adapted to supply a selection signal to a selector which receives e.g., six signals (signals to be selected) and which outputs at least two of the signals neighboring to each other. Referring to FIG. 6, which is used in the explanation of the present invention, the outline of the conventional decoding circuit is explained. This decoding circuit 80, shown in FIG. 6, has a clock selector 70 which generates signals (S0, S1, S2, S3, S4 and S5) for selecting sets of, for example, (CK0, CK1), (CK1, CK2), (CK2, CK3), (CK3, CK4), (CK4, CK5) and (CK5, CK0) from six-phase clocks (CK0, CK1, CK2, CK3, CK4, CK5) in a clock selector 70, depending on count value of (0–5) of a binary counter 110, and output the so selected sets.

If a signal to be selected corresponding to the selection signal which has a value of logic 1 is selected, and a signal to be selected corresponding to the selection signal which has a value of logic 0 is not selected, a rule for generating 6-bit selection signals (S0, S1, S2, S3, S4, S5) from 3-bit input signals is given as follows:

input signals→(S0, S1, S2, S3, S4, S5)
000→110000,
001→011000,
010→001100,
011→000110,
100→000011,
101→100001.

where it is noted that the input signals are derived from an output (count value) of the binary counter (110 of FIG. 6).

Meanwhile, as is well known, the decoding circuit (combinatorial circuit) receiving a N-bit signal for outputting 2N-bit decoded result signal is increased in circuit scale with an increasing value of N.

SUMMARY OF THE DISCLOSURE

Accordingly, it is an object of the present invention to provide a decoding circuit, a code conversion circuit and a code conversion method, whereby it is possible to decrease the circuit scale.

In accordance with one aspect of the present invention, the above and other objects are satisfied at least in part by providing a decoding circuit which receives as an input a 2N-bit signal composed of a N-bit signal and a signal obtained on inverting respective N-bits of said N-bit signal, where N is an integer not less than 2, and which is adapted to generate 2N types of decoded signals on inverting one bit in said 2N-bit signal received, wherein on the premise that the 2N-th bit and the first bit composing respectively one and other ends of the 2N-bit signal are adjacent to each other, among the 2N-bits of said decoded signal, one bit (if N=2), or neighboring plural (N−1) bits (if N<2), is/are of a first value, with the remaining bits being of a second value.

In the decoding circuit in accordance with the present invention, in which the 2N-th bit and the first bit at both ends of said 2N-bit signal composed of the N-bit signal and the signal obtained on inverting respective bits of said N-bit signal, are adjacent to each other, mutually neighboring N bits are preferably of a first value in succession.

In the decoding circuit in accordance with the present invention, said N-bit signal and the signal obtained on inverting respective bits of said N-bit signal are obtained preferably from non-inverting output terminals and inverting output terminals of N stage flip/flops composing a ring counter.

In the circuit in accordance with the present invention, said ring counter comprises: said N stage flip/flops; and N pieces of logic circuits, each of which is arranged for each of said flip/flops of said N stage flip/flops and each of which is adapted for supplying an input signal for the associated flip/flop, wherein each of said logic circuits, receiving as inputs an up signal, a down signal and a hold signal, indicating up-count, down-count and hold operations, respectively, is adapted so that in case of up-count operation of said ring counter, an inverted signal of an output of the last-stage flip/flop is fed back and input to said first stage flip/flop through the logic circuit associated with the first stage flip/flop, during shift operation by clock, the output state of a preceding stage flip/flop being through each of said logic circuits, propagated to an input of a succeeding stage flip/flop; in case of down-count operation of said ring counter, an inverted signal of an output of the initial stage flip/flop is fed back and input to said last stage flip/flop through the logic circuit associated with the last state flip/flop, during shift operation by clock, the output state of a succeeding stage flip/flop being through each of said logic circuits, propagated to an input of a preceding stage flip/flop; and in case of hold operation of said ring counter, an output signal of each flip/flop associated with each of said logic circuits is fed to an input of the flip/flop associated with each said logic circuit.

In the circuit in accordance with the present invention, there is provided a coincidence detection circuit for detecting the coincidence between said up signal and the down signal: an output of which is applied to each of said logic circuits as said hold signal.

In the circuit in accordance with the present invention, there is provided a circuit for coping with an exceptional pattern, occurrence of which is not assumed, said circuit including: means for receiving to output signals of said N-stage flip/flops composing said ring counter to detect said exceptional pattern; and means for substituting a pattern, occurrence of which is allowed, for said exceptional pattern on detection of said exceptional pattern to provide the pattern, occurrence of which is allowed, as an input to said decoding circuit.

A code conversion method in accordance with another aspect of the present invention includes the following steps, step 1: generating, by code generating means, a 2N-bit signal, composed by a N-bit signal and a signal obtained on inverting the respective N-bits of said N-bit signal, where N is an integer not less than 2; and step 2: generating by code conversion means, 2N types of signals from said 2N-bit signal generated by the step 1, on inverting one bit of said 2N-bit signal, wherein with the 2N-th bit and the first bit at either ends of the 2N-bit signal being adjacent to each other, among the 2N-bits, one bit is, if N=2, or plural neighboring (N−1) bits are, if N>2, of a first value, with the remaining bits being of a second value.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 1 shows a truth value table for illustrating the operation of a decoding circuit according to an embodiment of the present invention.

PREFERRED EMBODIMENTS OF THE INVENTION

Figure 2:
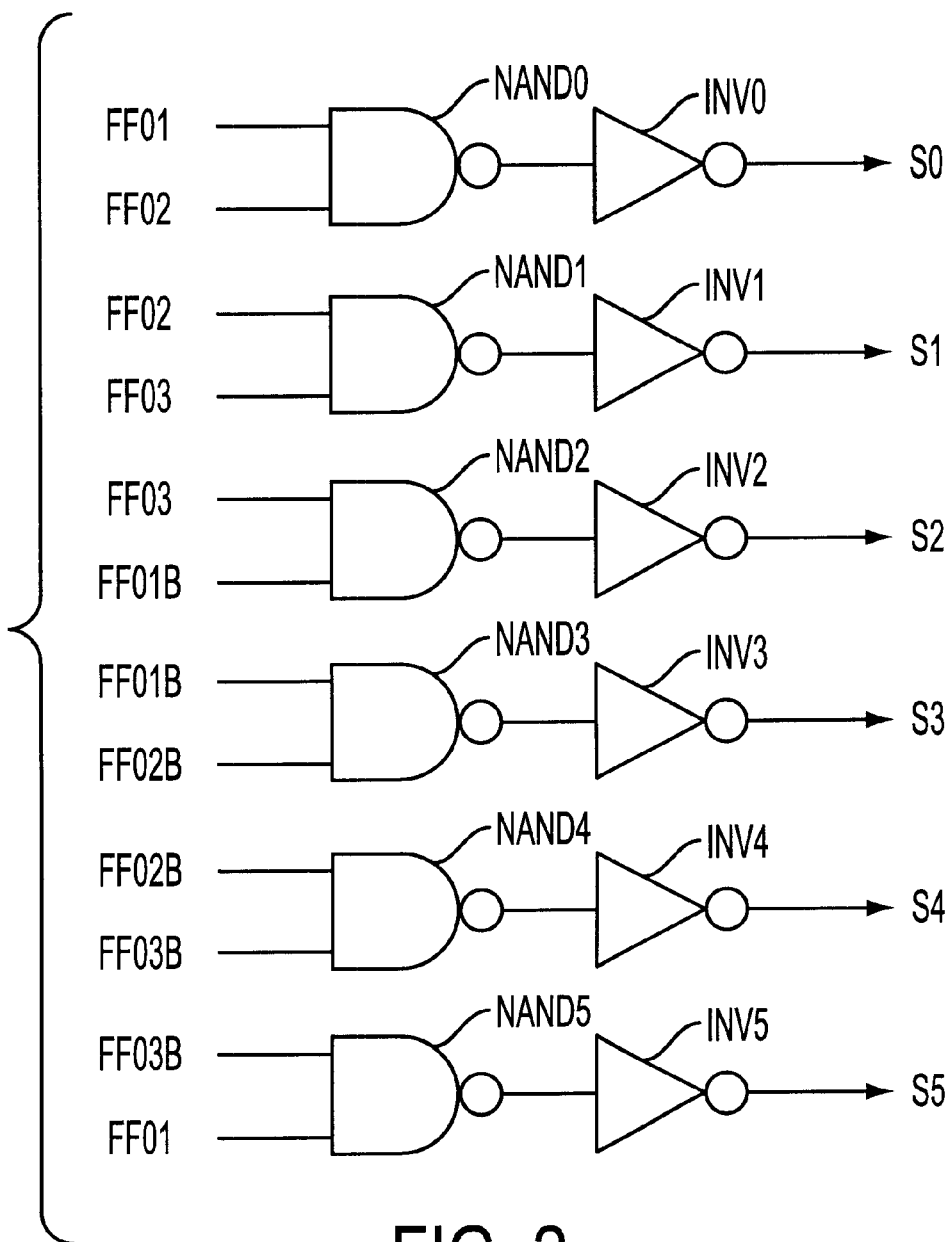
FIG. 2 illustrates an exemplary structure of a decoding circuit according to an embodiment of the present invention.

An embodiment of the present invention is now explained. FIG. 1 illustrates the basic principle of the code converting circuit according to the present invention. FIG. 1 shows, as a truth table, the operation of generating six types of 6-bit signals from the six types of 3-bit binary signals.

Referring to FIG. 1, the 6-bit signals are generated from the basic 3-bit signals and inverted signals obtained on inverting the basic 3-bits signal. This code conversion allows to obtain decoded result signals on simply inverting one of six bits composed of the three basic bits and the inverted signals thereof, thus realizing efficiency in circuit scale.

Referring to FIG. 1, if the decode result signal is "000110" for a 6-bit input pattern "000111" composed of the three basic bit signals and the inverted signal thereof, it is sufficient if the rightmost one bit of the 6-bit input pattern is inverted.

In the case of "100 011"→"000011" in the second row, where → denotes the decoded results, it is sufficient to invert the leftmost one bit of the 6-bit input pattern.

In the case of "110 001"→"100001" in the third row, it is sufficient to invert the second bit from the left end of the 6-bit input pattern.

In the case of "111 000"→"110000" in the fourth row, it is sufficient to invert the third bit from the left end of the 6-bit input pattern.

In the case of "011 100"→"011000" in the fifth row, it is sufficient to invert the fourth bit from the left end of the 6-bit input pattern.

In the case of "001 110"→"001100" in the sixth row, it is sufficient to invert the fifth bit from the left end of the 6-bit input pattern.

In the case of "000 111"→"000110" in the seventh row, it is sufficient to invert the sixth bit from the left end (rightmost bit) of the 6-bit input pattern. It is seen that the seventh row is the same as the first row, meaning that the circulation to the start pattern after sequentially passing through the six patterns has occurred.

Although the code conversion from three bits to six bits has been explained in the foregoing, the present invention is not to be limited to conversion from three bits to six bits. That is, the present invention is applied to code conversion from N-bits to 2N-bits, where N is an integer not less than 2, including a step of inputting a 2N-bit signal, made up by a N-bit signal and a signal obtained on inverting respective N-bits of the N-bit signal, where N is an integer not less than 2, and a step of inverting one of the 2N-bits to output 2N different signals, in which one set of (N−1) bits or plural neighboring sets each of (N−1) bits of the 2N-bits are of a first value, with the remaining bits being of a second value.

In a preferred embodiment of the present invention, N-bit signals and signals corresponding to a inverted version of the N-bit signals are supplied from non-inverting output terminal and an inverting output terminal of a N stage flip/flop forming a ring counter, respectively.

Alternatively, there may be provided a circuit for coping with an exceptional pattern, occurrence of which is not assumed. The circuit receives an output signal of an N-stage flip/flop constituting a ring counter and when detecting an exceptional pattern, occurrence of which is not assumed, the circuit replaces the exceptional pattern by another pattern, occurrence of which is allowed to provide the resulting pattern as the input signal for the decoding circuit.

In a preferred embodiment of the present invention, the decoding circuit is made up by 2N logic circuits each of which receives a I-th bit and a (I+1)-th bit of a 2N-bit signal composed of N-bit signals and the signal obtained on inverting respective bits of the N-bit signal, where I is 1, 2, −N, provided that, if I is 2N, 2N+1 is 1.

For further detailed explanation of the above-described embodiment of the present invention, a certain preferred embodiment of the present invention is explained by referring to the drawings. In this preferred embodiment, the basic three-bit signals may be obtained as output signals of a 3-bit ring counter. In a well-known manner, a ring counter is constituted by m stages of shift registers connected in a ring, in which by setting the logic value '1' as an initial value, shift clocks are counted depending on a position where the logic value '1' are present. The ring counter in which the number m stage output is inverted and feed-backed to the initial stage is commonly termed a 'Johnson counter' which, by resetting at the outset, counts up to 2m. In the case of, for example, a three-stage Johnson counter, three stages of the D-type flip/flops with resetting functions are arrayed and an inverted output of the third stage D-type flip/flop QB is fed back to a data input terminal of the initial stage D-type flip/flop, and a non-inverting output Q of a D-type flip/flop of a given stage is input to a data input terminal D of the D-type flip/flop of the next stage. The output of the three-stage flip/flops are changed sequentially "000", "100", "110", "111", "111", "011", "011" "000", responsive to input clocks.

FIG. 2 shows a, exemplary structure of a circuit, the truth table for which is shown in FIG. 1. In FIG. 2, FF01, FF02 and FF03 are output signals of the non-inverting output terminals of the three stage flip/flops making up a ring counter, while FF01B, FF02B and FF03B are output signals of the non-inverting output terminals of the three stage flip/flops making up the ring counter.

The 6-bit signals, forming the decoded result signals, (S0, S1, S2, S3, S4 and S5) can be generated by six pieces of two-input AND gates arranged in parallel, such that S0=AND (FF01, FF02)
S1=AND (FF02, FF03)
S2=AND (FF03, FF01B)
S3=AND (FF01B, FF02B)
S4=AND (FF02B, FF03B)
S5=AND (FF03B, FF01).

The circuit structure, mounted on a semiconductor integrated circuit, is made up by a two-input NAND gate, forming the basic cell, and an inverter INV, as shown in FIG. 2. A number I two-input NAND gate, where I is 1, 2, –N, receives as inputs a number I bit and a number (I+1) bit of 6-bit signals (FF01, FF02, FF03, FF01B, FF02B, FF03B), composed of basic 3-bit signals (FF01, FF02, FF03) and inverted signals thereof (FF01B, FF02B, FF03B), where I is 1, 2, –N on the condition that, if I is 2N, 2N+1 is 1.

Figure 3:
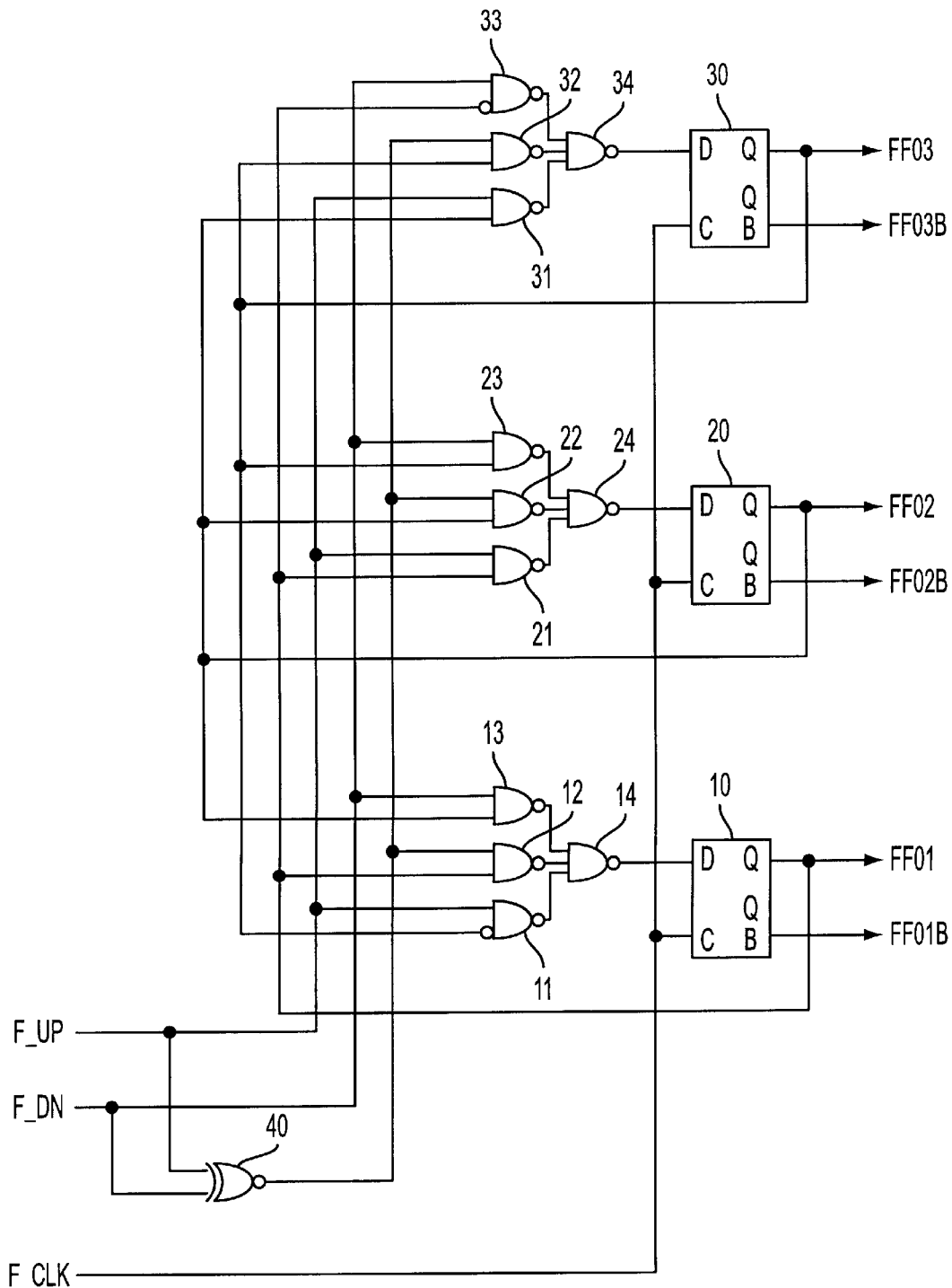
FIG. 3 shows an exemplary structure of a ring counter for applying an input signal to the decoding circuit according to an embodiment of the present invention.

FIG. 3 shows the structure of a ring counter, which generates basic three bits, provided to an input terminal of a decoding circuit shown in FIG. 2 and a inverted signals of the basic three bits, in an embodiment of the present invention.

Referring to FIG. 3, this three-bit ring counter receives an up-signal F_UP and a down-signal F_DN, as control signals, so that the count direction by the clock F_CLK can be switched between a up direction and a down direction. If the up-signal F_UP and the down-signal F_DN are both in active or inactive states, the ring counter is in its holding state.

More specifically, the ring counter includes D-type flip/flops 10, 20 and 30. Output signals of the non-inverting output terminals Q and the inverting output terminals QB of the respective flip/flops 10, 20 and 30 are provided as input signals (FF01, FF02, FF03, FF01B, FF02B and FF03B) to the decoding circuit shown in FIG. 2.

In association with the flip/flop 10, there is provided a first logic circuit, which receives non-inverting output signals of the three flip/flops 10, 20 and 30, a signal F_UP, enabling a count-up operation of a ring counter, a signal F_DN, enabling a count-down operation of the ring counter and an output signal of a coincidence detection circuit 40, detecting the coincidence between the signal F_UP and the signal F_DN, as input signals, to control the countup, countdown and hold operating state of the ring counter. This first logic circuit includes a NAND circuit 11, receiving F_UP and an inverted output Q of the flip/flop 30, as inputs, a NAND circuit 12, receiving an output of the coincidence detection circuit 40 and an output of the flip/flop 10, as inputs, a NAND circuit 13, receiving an output of the flip/flop 20 and F_DN, as inputs, and a NAND circuit 14, receiving outputs of the NAND circuits 11 to 13, as inputs. An output terminal of the NAND circuit 14 is connected to a data input terminal D of the flip/flop 10.

In association with the flip/flop 20, there is provided a second logic circuit, which receives output signals of the three flip/flops 10, 20 and 30, the signal F_UP, enabling the countup operation of the ring counter, the signal F_DN, enabling a countdown operation of the ring counter and an output of the coincidence detection circuit 40 for detecting the coincidence between the signals F_UP and F_DN, as inputs, and which controls the countup/countdown and hold operating states of the ring counter. This second logic circuit includes a NAND circuit 21, receiving F_UP and with an output Q of the flip/flop 10, as inputs, a NAND circuit 22, receiving an output of the coincidence detection circuit 40 and an output of the flip/flop 20, as inputs, a NAND circuit 23, receiving an output of the flip/flop 30 and F_DN, as inputs, and a NAND circuit 24, receiving outputs of the NAND circuits 21 to 23, as inputs. The NAND circuit 24 has an output terminal connected to the data input terminal D of the flip/flop 20.

In association with the flip/flop 30, there is provided a third logic circuit, which receives output signals of the three flip/flops 10, 20 and 30, the signal F_UP, enabling the countup operation of the ring counter, the signal F_DN, enabling the countdown operation of the ring counter, and an output of the coincidence detection circuit 40, detecting the coincidence between the signals F_UP and F_DOWN, as outputs, and which controls the countup/countdown and hold operating states of the ring counter. This third logic circuit includes a NAND circuit 31, receiving F_UP and an output Q of the flip/flop 20, as inputs, a NAND circuit 32, receiving an output of the coincidence detection circuit 40 and an output of the flip/flop 30, as inputs, a NAND circuit 33, receiving an output of the flip/flop 10 and F_DN, as inputs, and a NAND circuit 34, receiving outputs of the NAND circuits 31 to 33, as inputs. The NAND circuit 34 has an output terminal connected to the data input terminal D of the flip/flop 30.

The operation of the ring counter, shown in FIG. 3, is now explained. The signal values at the non-inverting output terminals Q of the respective flip/flops 10, 20 and 30 are of logic 0 (for example, the respective flip/flops 10, 20 and 30 are reset e.g., in an initial state). When the UP signal F_UP is of logic 1, the output of the NAND circuit 11 is of logic 0, so that the output of the NAND circuit 14 is of logic 1. Thus, with the rising transition of a clock F_CLK, the flip/flop 10 outputs the signal of logic 1 at its non-inverting output terminal Q. At this time, the data input terminals D of the flip/flops 20, and 30 are of logic 0, so that the flip/flops 20, and 30 output logic 0.

With a result of the transition of the output signal FF01 of the non-inverting output terminal Q of the flip/flop 10 to logic 1, the output of the NAND circuit 21 become logic 0, with the NAND circuit 24 outputting logic 1. With the rise transition of the clock F_CLK, the flip/flop 20 outputs logic 1 at the non-inverting output terminal Q. The three-bit signal at the non-inverting output terminals Q of the flip/flops 10, 20 and 30 is "110".

By the output signal FF02 of the flip/flop 20 now being logic 1, the output of the NAND circuit 31 is logic 0, so that the NAND circuit 34 outputs logic 1. With the rise transition of the clock F_CLK, the flip/flop 30 outputs logic 1 to the non-inverting output terminal Q. The three-bit signal at the non-inverting output terminals Q of the flip/flops 10, 20 and 30 is "111".

By the output signal FF03 of the flip/flop 30 now being logic 1, the non-inverting output terminal Q of the NAND circuit 11 is at logic 1, so that the NAND circuit 14 outputs logic 0. With the rise transition of the clock F_CLK, the flip/flop 10 outputs logic 0. The three-bit signal at the non-inverting output terminals Q of the flip/flops 10, 20 and 30 is "011".

By the output signal FF01 of the flip/flop 10 now being logic 0, the output of the NAND circuit 21 is logic 1, so that the NAND circuit 24 outputs logic 0. With the rise transition of the clock F_CLK, the flip/flop 20 outputs logic 0. The three-bit signal at the non-inverting output terminals Q of the flip/flops 10, 20 and 30 is "001".

By the output signal FF02 of the flip/flop 20 now being logic 0, the output of the NAND circuit 31 is logic 1, so that the NAND circuit 34 outputs logic 0. With the rise transition of the clock F_CLK, the flip/flop 30 outputs logic 0. The three-bit signal at the non-inverting output terminals Q of the flip/flops 10, 20 and 30 is "000".

When the F_DN signal is logic 1 (F_UP being logic 0), the pattern shifting direction is reversed from that when the F_UP is logic 1. The output of the NAND circuit 33 is logic 0, while that of the NAND circuit 34 is logic 1. With rise of the clock F_CLK, the flip/flop 30 outputs logic 1. The three-bit signal of the non-inverting output terminal Q is "001".

By the output FF03 of the flip/flop 30 being logic 1, the output of the NAND circuit 23 is logic 0, while the NAND circuit 24 outputs logic 1. With the rise of the clock F_CLK, the flip/flop 20 outputs logic 1. The 3-bit signal at the non-inverting output terminals Q of the flip/flops 10, 20 and 30 is "101".

By the output FF02 of the flip/flop 20 being logic 1, the output of the NAND circuit 23 is logic 0, while the NAND circuit 14 outputs logic 1. With the rise of the clock F_CLK, the flip/flop 10 outputs logic 1. The 3-bit signal at the non-inverting output terminals Q of the flip/flops 10, 20 and 30 is "111.

By the output FF01 of the flip/flop 10 being logic 1, the output of the NAND circuit 33 is logic 1, while the NAND circuit 34 outputs logic 0. With the clock F_CLK, the flip/flop 30 outputs logic 0. The 3-bit signal of the non-inverting output terminals Q of the flip/flops 10, 20 and 30 is "110". Subsequently, with each clock input, the 3-bit signal is sequentially changed through "100" to "000".

On the other hand, when the logic values of the F_DN and R_UP signals coincide with each other, an output of the coincidence detection circuit 40, composed of an XNOR (exclusive NOR) circuit, is logic 1. The values of the non-inverting output terminals Q of the flip/flops 10, 20 and 30 are through NAND circuits 12, 22 and 32 fed back to data input terminals D of the flip/flops 10, 20 and 30, respectively. The flip/flops 10, 20 and 30 sample signals of the data input terminals D, with the rise of the clock F_CLK, to output the sampled signals, to keep the states of the flip/flops 10, 20 and 30.

The ring counter, composed of three-stage flip/flops, cyclically generates a sequence of six patterns. Meanwhile, three-bit signals may assume $2^3=8$ combinations. Of the basic three bits of the 3-bit ring counter, two 2 sets of bit patterns (0,1,0), (1,0,1) represent patterns, or exceptional patterns, occurrences of which are not assumed. It is therefore desirable to provide a remedying circuit which operates so that, if these exceptional patterns are generated due to, for example, noise, these patterns are converted into other patterns.

Figure 4A:
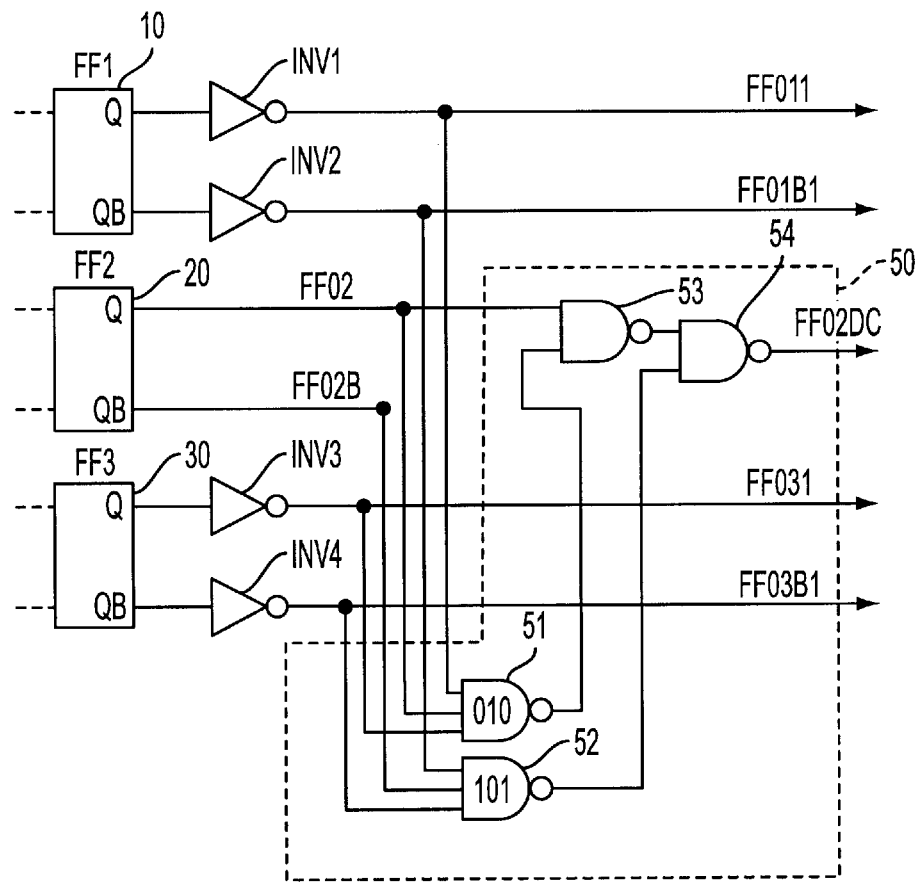
FIG. 4a shows an exemplary structure of a ring counter and a circuit for coping with the exceptional pattern according to an embodiment of the present invention and FIG. 4b shows an exemplary structure of a decoding circuit.

FIG. 4a shows the structure of a circuit 50 for coping with the exceptional patterns, inserted across an output of the ring counter and an input terminal of the decoding circuit.

In the 3-bit output patterns (FF01, FF02, and FF03) of the ring counter, shown in FIG. 3, there lack the two patterns "010", and "101". If these exceptional patterns are produced due to, for example, noise, these exceptional patterns are set to preset ones of the normally appearing patterns, occurrences of which are allowed, by way of remedying.

This circuit 50 for coping with the exceptional patterns changes the exceptional 3-bit signals "010" and "101" to "000" and to "111", respectively.

This circuit 50 for coping with the exceptional patterns is made up by a NAND circuit 51, which receives a signal output from an inverter INV1, which inverts the signal output from the non-inverting output terminal Q of the flip/flop 10, a signal from the non-inverting output terminal Q of the flip/flop 20, and a signal from an inverter INV3 which inverts the signal output from the non-inverting output terminal Q of the flip/flop 30, and which outputs logic 0 when the three input signals are all logic 1, a NAND circuit 52 which receives a signal from an inverter INV2 which inverts the signal from he inverting output terminal QB of the flip/flop 10, a signal output from the non-inverting output terminal Q of the flip/flop 20, and a signal output from an inverter INV4 which inverts the signal output from the non-inverting output terminal Q of the flip/flop 30, inverted by, and which outputs logic 0 when the three input signals are all logic 1, a NAND circuit 53, receiving an output of the flip/flop 20 and with an output of the NAND circuit 51 as inputs and a NAND circuit 54 receiving outputs of the NAND circuits 53, and 52 as inputs to output a signal FF02DC.

When the three-bit signal of the non-inverting output terminals Q of the flip/flops 10, 20 and 30 is "010", the NAND circuit 51 outputs logic 0, while the NAND circuit 53 outputs logic 1. An output terminal of the NAND circuit 54 outputs logic 0, inverted from logic 1 output by the NAND circuit 52, as FF02DC. On the other hand, when the three bit signal of the non-inverting output terminals Q of the flip/flops 10, 20 and 30 is "101", the output of the NAND circuit 52 is logic 0. At this time, the output terminal of the NAND circuit 54 outputs logic 1 as FF02DC.

In case the circuit 50 for coping with the exceptional patterns is provided, the signals input to the NAND circuits 13, 22 and 31 in the ring counter shown in FIG. 3 is not FF02 but the output signal FF02DC of the circuit 50 for coping with the exceptional patterns.

Figure 4B:
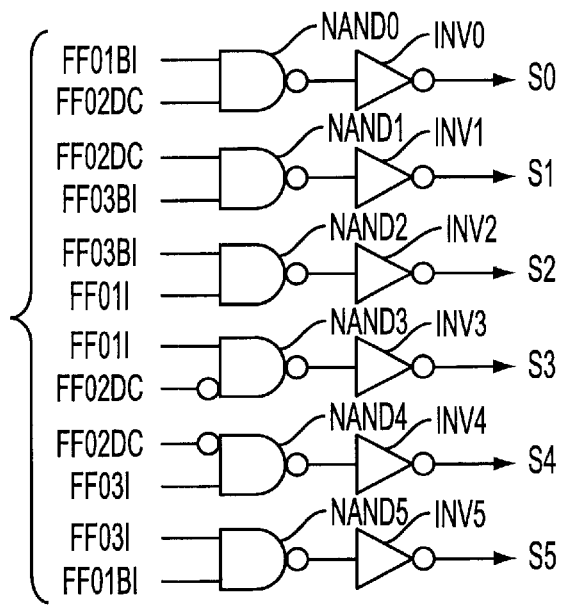

FIG. 4b shows the structure of a decoding circuit, receiving the output signal FF02DC of the circuit 50 for coping with the exceptional patterns, and with signals FF01I, FF01B1, FF03I and FF03B1, obtained on inverting non-inverting outputs Q and inverting outputs QB of the flip/flops 10, and 30 of the ring counter. Referring to FIG. 4b, this decoding circuit differs from the circuit structure shown in FIG. 2 in that the input terminals of the NAND3, and NAND4 receiving FF02DC are inverting (negative logic) type. It should be noted that the sequence of signal connection configuration of the input terminals of the decoding circuit shown in FIG. 4b differs from that shown in FIG. 2, because the outputs of the flip/flops making up the ring counter are inverted by the inverters. However, the logic is the same as that shown in FIG. 2.

S0=AND (FF01B1, FF02DC)
S1=AND (FF02DC, FF03B1)
S2=AND (FF03B1, FF01I)
S3=AND (FF01I, inverted FF02DC)
S4=AND (inverted FF02DC, FF03I)
S5=AND (FF03I, FF01B1).

Figure 5:
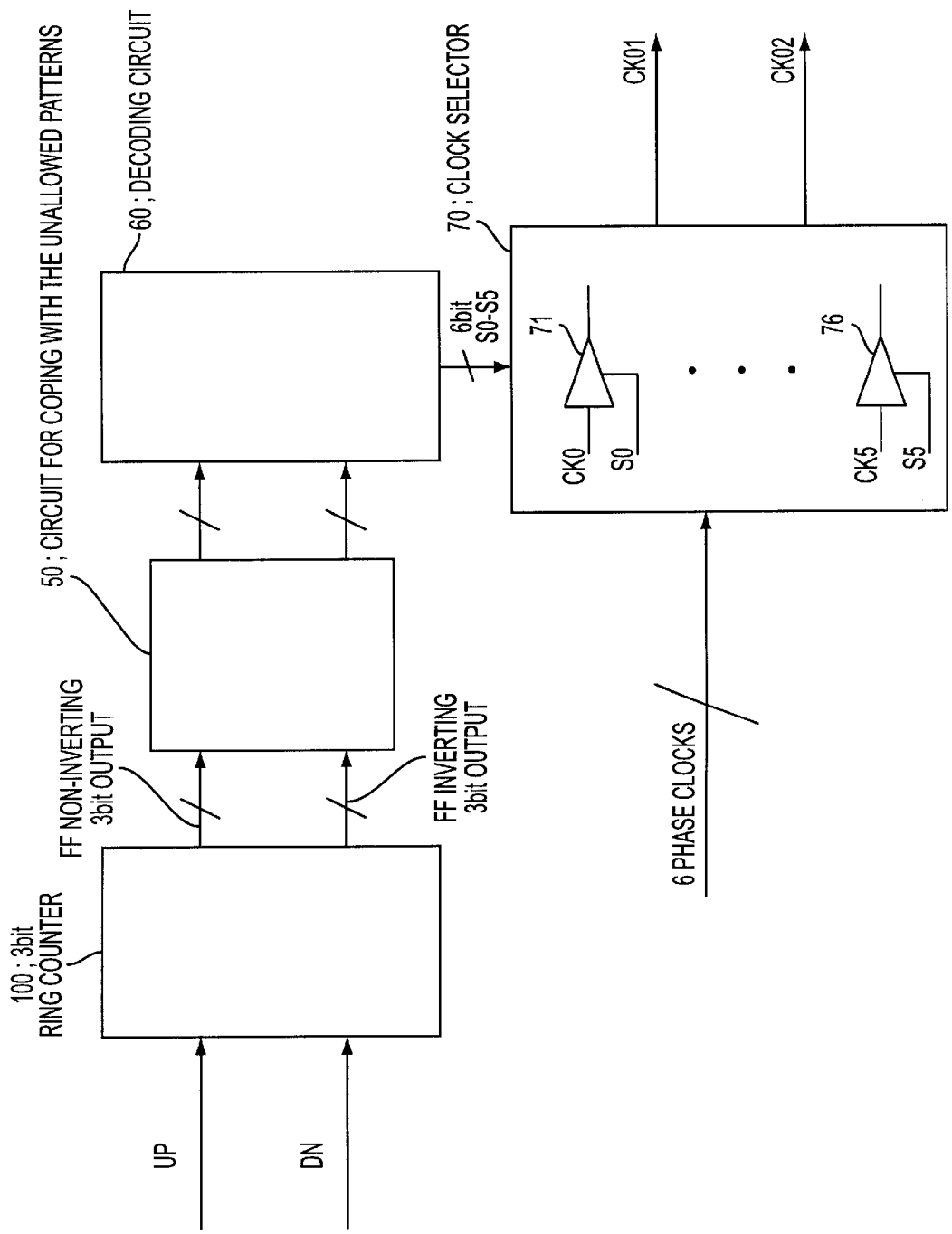
FIG. 5 shows an instance of a specified circuit structure embodying the present invention.

FIG. 5 shows an exemplary structure of the code converting circuit of the present invention, as applied to a decoding circuit. Specifically, this figure shows a circuit structure for generating selection signals S0 to S5, adapted for generating a two-phase clock pair each clock of which has two mutually neighboring phases of the six-phase clocks.

A 3-bit ring counter 100 is a 3-bit ring counter for upcounting and downcounting responsive to control signals UP and DOWN provided from outside, respectively, and is configured by the circuit shown in FIG. 3. Meanwhile, the control signals UP and DOWN are output based on the results of phase comparison by a phase comparator, not shown, adapted for comparing a reference signal, not shown, to the signal selected by a clock selector 70 and subsequently phase-adjusted by an interpolator, not shown. The control signals UP and DOWN are used for switching the clock pairs selected by the clock selector 70 in case the signal phase is to be advanced or delayed further. The circuit 50 for coping with the exceptional patterns and a decoding circuit 60 are configured as shown in FIGS. 4*a* and 4*b*, respectively.

The clock selector 70 includes six pieces of three-state buffers 71 to 76, outputs of which are enabled or disabled by the selection signal and are in a state of logic 1,0 or in a HiZ (high impedance) state. The three-state buffers 71 to 76 receives six-phase clocks (CK0 to CK5), obtained on equally dividing one clock period (360°), and select two clock signals with relatively adjacent phases to output a clock signal pair CK01, CK02 from two output terminals. The clock selector 70 selects those of the clock selection signals S0 to S5 having the values equal to logic 1 to output the so selected clocks at the two output terminals. Of the six-phase clocks CK0 to CK5, outputs of the three pieces of three-state buffers, receiving even phase clocks (CK0, CK2, and CK4), are connected to the first output terminal in common, while outputs of the three pieces of three-state buffers, receiving odd phase clocks (CK0, CK3, and CK5), are connected to the second output terminal in common.

An output of the one of the tri-state buffers, which receives the even phase clocks (CK0, CK2, and CK4) and which has its output enabled by the selection signal, is output as CK01, while an output of the one of the tri-state buffers, which receives the odd phase clocks (CK1, CK3, and CK5) and which has its output enabled by the selection signal, is output as CK02. As the clock pair (CK01, CK02), having adjoining phases to each other, one of sets of (CK0, CK1), (CK2, CK1), (CK2, CK3), (CK4, CK3), (CK4, CK5) and (CK0, CK5), is selected and output.

It should be noted that the output signals S0, S1, S2, S3, S4 and S5 of the decoding circuit 60 may be provided as output enable control signals for the tri-state buffers, having the clock signals CK3, CK4, CK5, CK0, CK1 and CK2 as inputs, respectively, or may be supplied in other connection configurations, only subject to the condition that the signal sequence is maintained among the signals S0 to S5.

Figure 6:
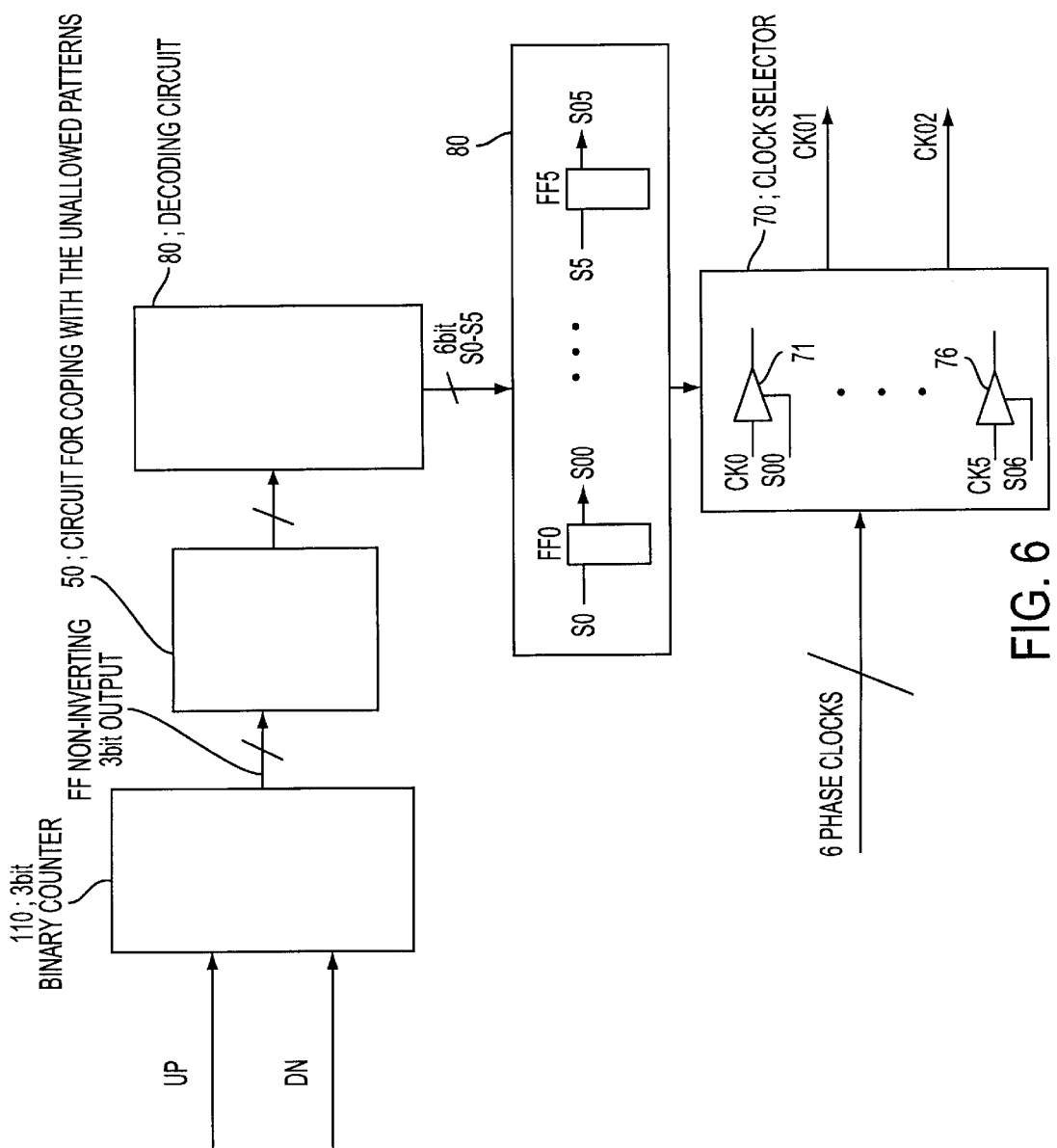
FIG. 6 shows a comparative example for comparison to the embodiment of the present invention.

FIG. 6 shows, by way of comparison, the structure employing not a ring counter but a binary counter. If the binary counter counts from 0 to 5, there are occasions where two bits are changed simultaneously during count-up/count-down, such as from "000" through "001", 010", "010"and "100" to "101". In order to address the problem of noise that may be generated due e.g., to delay at the time of concurrent change of two bits, in the decoding circuit, outputs S0 to S5 of the decoding circuit 70 is re-timed by a latch circuit 80 to send the so re-timed signals as selection signals to the clock selector 70.

In the present invention, only one bit is changed at the time of change of the 6-bit signals, input to the decoding circuit, so that the latch circuit shown in FIG. 6 may be omitted.

It should be noted that the circuit which decodes a 3-bit output of the binary counter to generate 6-bit data is increased in circuit size as compared to the circuit employing a ring counter.

The meritorious effects of the present invention are summarized as follows.

According to the present invention, as described above, the circuit generating N different decoded signals may be reduced in size, in a manner convenient for integration.

Moreover, in the present invention, there is provided a ring counter for generating N types of patterns and the pattern output by the ring counter and the pattern obtained on inverting signal thereof are employed, only one bit is changed when the output of the ring counter is changed. Thus, special measures against e.g. the noise are not needed to achieve high reliability and a reduced circuit scale.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A decoding circuit, receiving as an input a 2N-bit signal composed of a N-bit signal and a signal obtained on inverting respective N-bits of said N-bit signal, where N is an integer not less than 2, said decoding circuit being adapted to generate 2N types of decoded signals on inverting one bit in said 2N-bit signal received, wherein on the premise that the number 2N bit and a first bit composing respectively one and other ends of the 2N-bit signal are adjacent to each other, among the 2N-bits of said decoded signal, one bit is, if N being equal to 2, or neighboring plural (N−1) bits are, if N being greater than 2, of a first value, with the remaining bits being of a second value.

2. The decoding circuit as defined in claim 1, wherein on the premise that the number 2N bit and the first bit at both ends of said 2N-bit signal composed of the N-bit signal and the signal obtained on inverting respective bits of said N-bit signal, are adjacent to each other, mutually neighboring N bits are of a first value in succession.

3. The decoding circuit as defined in claim 1, wherein said N-bit signal and the signal obtained on inverting respective bits of said N-bit signal are obtained from non-inverting output terminals and inverting output terminals of N stage flip/flops composing a ring counter.

4. The decoding circuit as defined in claim 3, wherein said ring counter comprises:

said N stage flip/flops; and

N pieces of logic circuits, each of which is arranged for each of said flip/flops of said N stage flip/flops and each of which is adapted for supplying an input signal for the associated flip/flop, wherein each of said logic circuits, receiving as inputs an up signal, a down signal and a hold signal, indicating up-count, down-count and hold operations, respectively, is adapted so that in case of up-count operation of said ring counter, an inverted signal of an output of the last-stage flip/flop is fed back and input to said first stage flip/flop through the logic circuit associated with the first stage flip/flop, during shift operation by clock, the output state of a preceding stage flip/flop being through each of said logic circuits, propagated to an input of a succeeding stage flip/flop;

in case of down-count operation of said ring counter, an inverted signal of an output of the initial stage flip/flop is fed back and input to said last stage flip/flop through the logic circuit associated with the last state flip/flop, during shift operation by clock, the output state of a succeeding stage flip/flop being through each of said logic circuits, propagated to an input of a preceding stage flip/flop; and in case of hold operation of said ring counter, an output signal of each flip/flop associated with each of said logic circuits is fed to an input of the flip/flop associated with each said logic circuit.

5. The decoding circuit as defined in claim 4 further comprising a coincidence detection circuit for detecting the coincidence between said up signal and said down signal, wherein an output of said coincidence detection circuit being applied to each of said logic circuits as said hold signal.

6. The decoding circuit as defined in claim 3 further comprising a circuit for coping with an exceptional pattern, occurrence of which is not assumed, said circuit including:

means for receiving output signals of said N-stage flip/flops composing said ring counter to detect said exceptional pattern; and means for substituting a pattern, occurrence of which is allowed, for said exceptional pattern on detection of said exceptional pattern to provide the pattern, occurrence of which is allowed, as an input to said decoding circuit.

7. The decoding circuit as defined in claim 1, comprised of 2N pieces of logic circuits, each of which receives a number I bit and a number (I+1) bit of the 2N-bit signal composed of said N-bit signals and the signal obtained on inverting respective bits of said N-bit signal, where I is 1, 2, –N, provided that, if I is 2N, 2N+1 is equal to 1.

8. A code conversion circuit comprising:

first circuit means, receiving a N-bit signal, for generating a signal of 2N-bit width, from said N-bit signal and a signal obtained on inverting the respective N-bits of said N-bit signal, where N is an integer not less than 2; and second circuit means, receiving the signal of 2N-bit width generated by said first circuit means, for generating 2N types of signals of 2N-bit width from said 2N-bit signal on inverting one bit in said 2N-bit signal, wherein on the premise that the number 2N bit and the first bit at either ends of the 2N-bit signal are adjacent to each other, among the 2N-bits, one bit is, if N being equal to 2, or neighboring plural (N–1) bits are, if N being greater than 2, of a first value, with the remaining bits being of a second value.

9. The code conversion circuit as defined in claim 8 wherein said first circuit means generates a signal of 2N-bit width in which mutually neighboring N bits are of a first value in succession, on the premise that the 2N number bit and the first bit at both ends of said 2N-bit signal composed of the N-bit signal and the signal obtained on inverting respective bits of said N-bit signal, are adjacent to each other.

10. The code conversion circuit as defined in claim 8 wherein said first circuit means includes a ring counter comprised of N-stage flip/flops, non-inverting output terminals and inverting output terminals of which generate said N-bit signal and the signal obtained on inverting the respective N bits of said N-bit signal.

11. The code conversion circuit as defined in claim 8 wherein said ring counter comprises:

said N stage flip/flops; and

N pieces of logic circuits each of which is arranged for each of said N stage flip/flops and each of which is adapted for supplying an input signal of the associated flip/flop; wherein each of said logic circuits, receiving as inputs an up signal, a down signal and a hold signal, indicating up-count, down-count and hold operations, respectively, is adapted so that in case of up-count operation of said ring counter, an inverted signal of an output of the last-stage flip/flop is fed back and input to said first stage flip/flop through the logic circuit associated with the first stage flip/flop, during shift operation by clock, the output state of a preceding stage flip/flop being through each of said logic circuits, propagated to an input of a succeeding stage flip/flop;

in case of down-count operation of said ring counter, an inverted signal of an output of the first stage flip/flop is fed back and input to said last stage flip/flop through the logic circuit associated with the last state flip/flop, during shift operation by clock, the output state of a succeeding stage flip/flop being through each of said logic circuits, propagated to an input of a preceding stage flip/flop; and in case of hold operation of said ring counter, an output signal of each flip/flop associated with each of said logic circuits is fed to an input of the flip/flop associated with each said logic circuit.

12. The code conversion circuit as defined in claim 11 further comprising a coincidence detection circuit for detecting the coincidence between said up signal and said down signal, wherein an output of said coincidence detection circuit is applied to each logic circuit.

13. The code conversion circuit as defined in claim 8 further comprising a circuit for coping with an exceptional pattern, occurrence of which is not assumed, said circuit including:

means for receiving output signals of said N-stage flip/flops composing said ring counter to detect said exceptional pattern; and means for substituting a pattern, occurrence of which is allowed, for said exceptional pattern on detection of said exceptional pattern to provide the pattern, occurrence of which is allowed, as an input to said decoding circuit.

14. The code conversion circuit as defined in claim 8, comprising 2N pieces of logic circuits each of which receives a number I bit and a number (I+1) bit of 2N-bit signal composed of said N-bit signals and the signal obtained on inverting respective bits of said N-bit signal, where I is 1, 2, –N, provided that, if I is 2N, 2N+1 is 1.

15. A code conversion method comprising:

a first step for generating, by code generating means, a 2N-bit signal, composed by a N-bit signal and a signal obtained on inverting the respective N-bits of said N-bit signal, where N is an integer not less than 2; and a second step for generating by code conversion means, 2N types of signals from said 2N-bit signal generated in said first step, with the inversion of one bit in said 2N-bit signal, wherein on the premise that the number 2N bit and the first bit at either ends of the 2N-bit signal are adjacent to each other, among the 2N-bits, one bit is, if N being equal to 2, or neighboring plural (N−1) bits are, if N being greater than 2, of a first value, with the remaining bits being of a second value.

16. The code conversion method as defined in claim 15 wherein in said first step, said code generating means generates a 2N-bit signal in which mutually neighboring N bits are of a first value in succession, on the premise that the number 2N bit and the first bit at both ends of said 2N-bit signal composed of the N-bit signal and the signal obtained on inverting respective bits of said N-bit signal, are adjacent to each other.

17. The code conversion method as defined in claim 15 wherein, in said first step, said N-bit signal and the signal obtained on inverting respective bits of said N-bit signal is of a pattern supplied from non-inverting output terminals and from inverting output terminals of N-stage flip/flops composing a ring counter of said code generating means.

18. A decoder comprising:

2N pieces of logic circuits, receiving a 2N-bit signal composed of a N-bit signal and a signal obtained on inverting respective bits of said N-bit signal, provided respectively from non-inverting outputs and inverting outputs of N-stages of flip/flops composing a ring counter;

wherein said logic circuit receives respectively from first and second input terminals a number I bit and a number (I+1) bit of said 2N-bit signal, where I is 1, 2, −N, provided that, if I is 2N, 2N+1 is 1; and wherein said logic circuit outputs from an output terminal a result of logic operation of the two signals respectively input from said first and second input terminals.

19. A clock control circuit comprising:

a clock selector for selecting at least two neighboring clock signals of input multi-phase clock signals; and a decoding circuit as defined in claim 1 for supplying a selection signal for selecting at least two neighboring clock signals to said clock selector.

20. The decoding circuit as defined in claim 2, comprised of 2N pieces of logic circuits, each of which receives a number I bit and a number (I+1) bit of the 2N-bit signal composed of said N-bit signals and the signal obtained on inverting respective bits of said N-bit signal, where I is 1, 2, −N, provided that, if I is 2N, 2N+1 is equal to 1.

21. The code conversion circuit as defined in claim 9, comprising 2N pieces of logic circuits each of which receives a number I bit and a number (I+1) bit of 2N-bit signal composed of said N-bit signals and the signal obtained on inverting respective bits of said N-bit signal, where I is 1, 2, −N, provided that, if I is 2N, 2N+1 is 1.

* * * * *